(12) United States Patent
Ono

(10) Patent No.: US 6,335,127 B1
(45) Date of Patent: Jan. 1, 2002

(54) CHARGED BEAM MASK HAVING STRUT WIDER THAN CHARGED BEAM, WITH SHAPE THAT MATCHES CHARGED BEAM

(75) Inventor: Haruhito Ono, Minamiashigara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/339,940

(22) Filed: Jun. 25, 1999

(30) Foreign Application Priority Data

Jun. 25, 1998 (JP) .......................................... 10-178815

(51) Int. Cl.⁷ ................................................ G03F 9/00
(52) U.S. Cl. ............................ 430/5; 430/296; 430/942
(58) Field of Search .............................. 430/5, 296, 942

(56) References Cited

U.S. PATENT DOCUMENTS 6,040,095 A * 3/2000 Enichen et al. ................ 430/5

* cited by examiner

*Primary Examiner*—Christopher G. Young
(74) *Attorney, Agent, or Firm*—Fitzpatrick, Cella, Harper & Scinto

(57) ABSTRACT

This invention provides a charged beam projection mask, a charged beam exposure apparatus, and the like which prevent variations in exposure dose and a positional error of a pattern projected on a wafer, thereby improving a pattern precision. In the charged beam mask, strut portions separating mask pattern regions constituting a stripe in one direction have a width larger than the width of a beam on the mask.

17 Claims, 21 Drawing Sheets

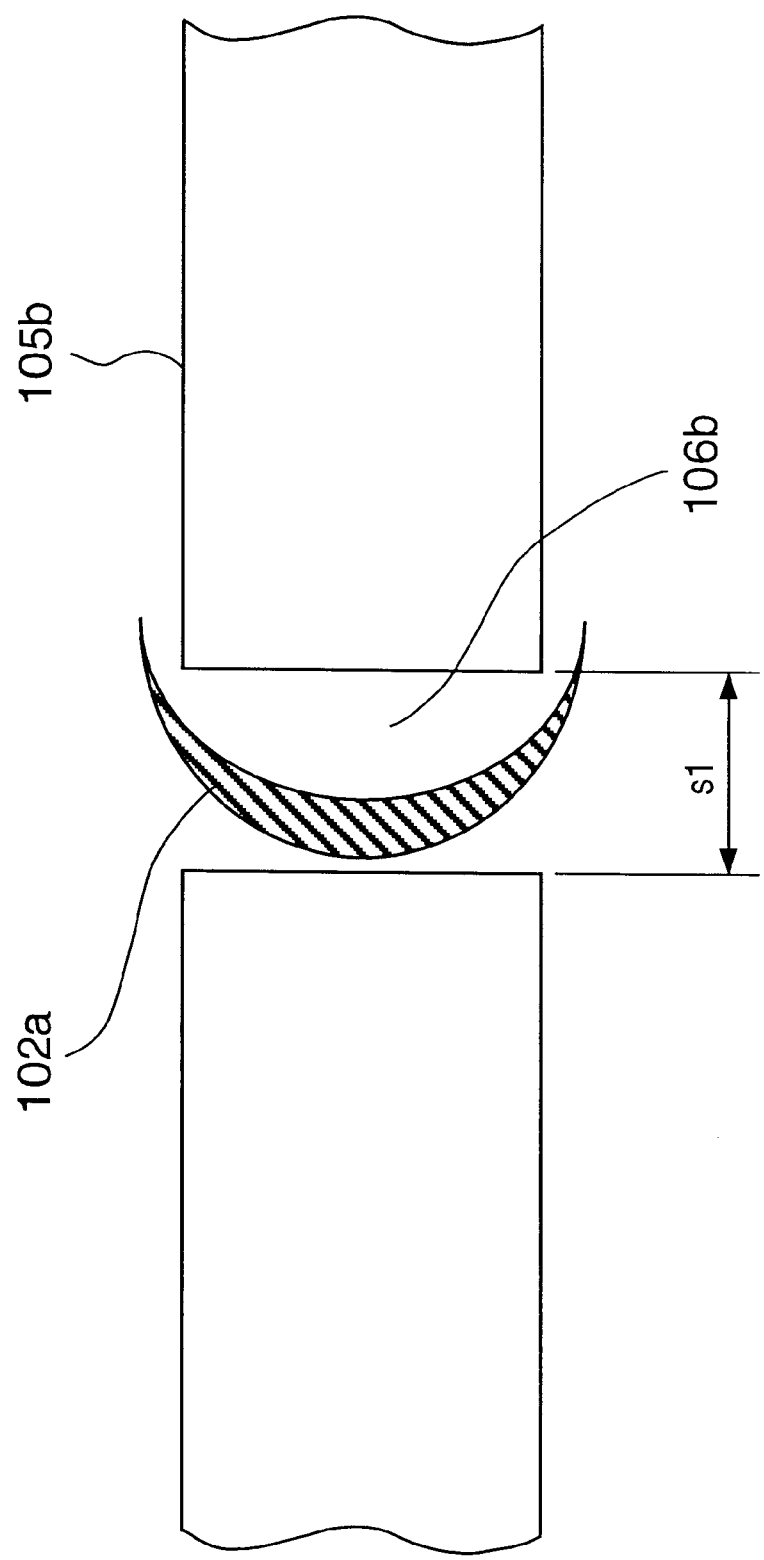

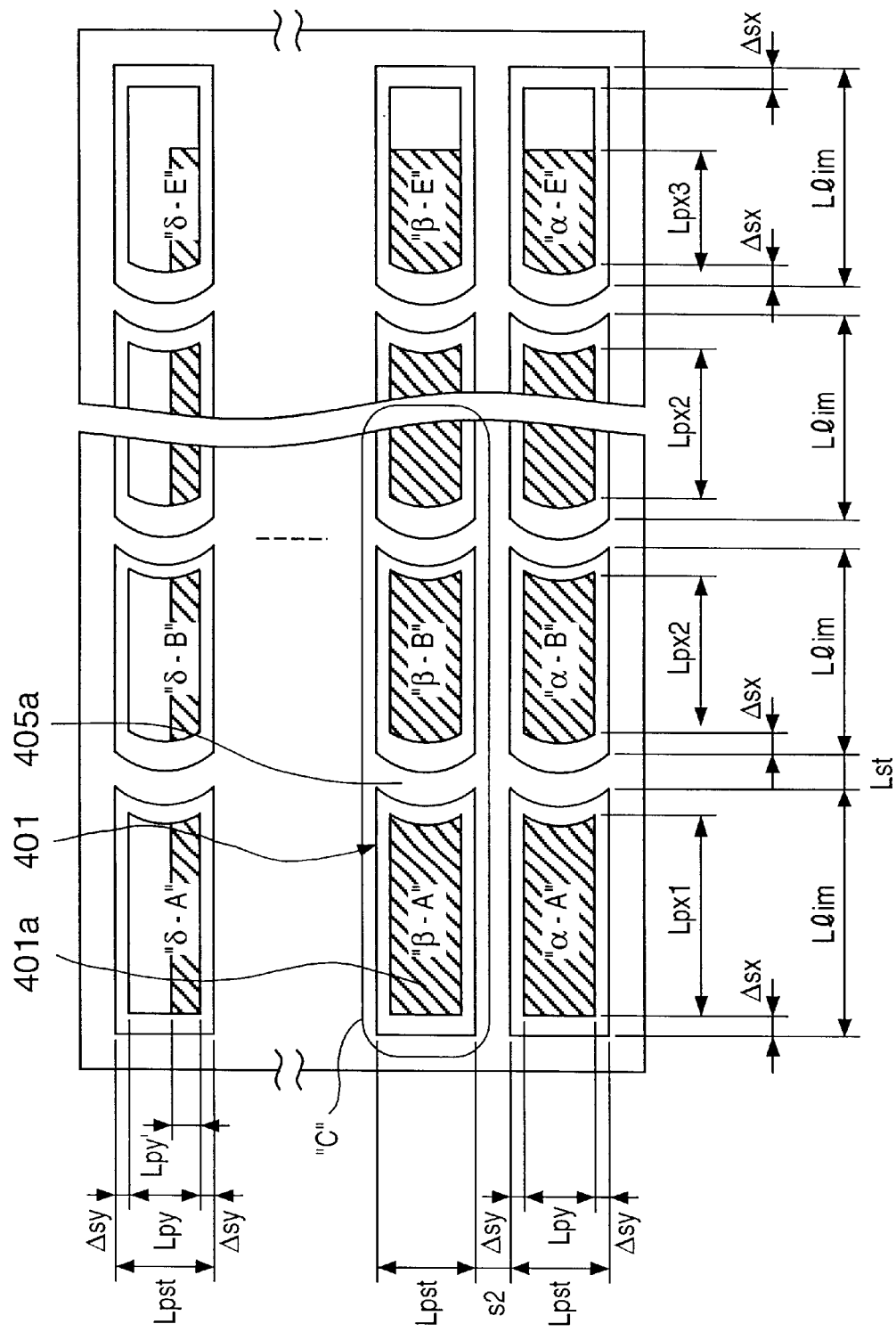

405b 606a    605a 606b    605b

CHARGED BEAM MASK HAVING STRUT WIDER THAN CHARGED BEAM, WITH SHAPE THAT MATCHES CHARGED BEAM

BACKGROUND OF THE INVENTION

FIELD OF THE INVENTION

The present invention relates to a charged beam exposure technique in lithography of the manufacture of electronic devices such as semiconductor devices and, more particularly, to a mask used in exposing a wafer with a charged beam, a charged beam exposure apparatus using this mask, and a device manufacturing method employing this apparatus.

In mass production of semiconductor memory devices, an optical stepper having high productivity has been used. In production of next-generation memory devices of 1-gigabit or 4-gigabit DRAMs having a line width of 0.2 μm or less, the high-productivity electron beam exposure method having high resolving power is expected as one of the exposure techniques that replace the optical exposure system.

The conventional electron beam exposure method is mainly performed using a Gaussian beam or variable shaped beam system, and accordingly has a low productivity. Therefore, the electron beam exposure method has been used in applications such as mask drawing, research and development of VLSIs, and exposure of ASIC devices on small-lot production, by effectively using the characteristics of the excellent resolving performance of the electron beam.

To apply the electron beam exposure method to mass production in this manner, how to increase its productivity is a significant problem. In a conventional electron beam exposure apparatus, the exposure region of an electron optical system that can be exposed by one shot is extremely smaller than the exposure region of the projection optical system of an optical exposure apparatus. To expose the wafer entirely takes a very long period of time since the distances of electronic scanning and mechanical scanning become longer than in the optical exposure apparatus, resulting in an extremely low throughput. To increase the throughput, either the electronic scanning speed and the mechanical scanning speed must be further increased greatly, or the one-shot exposure region must be enlarged greatly.

As one of methods that solve this problem of throughput increase while maintaining a necessary resolving power, a following method is discussed. According to this method, a circuit pattern to be exposed onto a silicon wafer is formed on a mask. An electron beam having an enlarged exposure region irradiates the mask, so that the mask pattern is projected onto the wafer. As the electron beam having an enlarged exposure region, one having a rectangular spot is usually used. In the electron beam exposure apparatus shown in FIG. 18, the beam has an arcuate spot to decrease the curvature of field, so that the exposure region is further increased, thereby solving the above problem.

FIG. 18 shows an electron gun 101, an electron beam 602, an axis 120 of an electron optical system, a condenser lens 103, an aperture 104, a mask 605, an aberration correcting optical system 107, electron lenses 108A and 108B, a scattered electron limiting aperture 111, a wafer 114, a moving direction 121 of the mask stage at a certain time point, a moving direction 122 of the wafer stage at a certain time point, an aperture opening 201, an electron beam irradiated region 202 on the mask, a device pattern 603 on the wafer, and a region 604 to be irradiated with an electron beam by wafer moving.

The electron beam mask used in this electron beam exposure apparatus has a circuit pattern the size of which depends on the magnification of the projection system of the electron beam exposure apparatus and is usually twice to 5 times that of the circuit pattern on the silicon wafer. For example, it is said that a circuit pattern corresponding to one 4-gigabit DRAM chip requires an area of about 20 mm×35 mm. The area of the circuit pattern on the mask used for exposing this circuit pattern is 80 mm×140 mm when the magnification of the projection system is ¼. It is difficult to form a circuit pattern of this size on one thin film portion 605a surrounded by a reinforced portion 606a on the mask, as shown in FIG. 19A, with a sufficiently large strength and sufficiently high precision. Hence, as schematically shown in FIG. 19B, this circuit pattern is divisionally formed on a plurality of thin film portions 605b into a plurality of chip patterns M1 to M9, and the respective divided chip patterns are reinforced with a rectangular bar portion 606b (the portion will be referred to as a strut hereinafter).

To expose the chip patterns M1 to M9 divided on the mask onto the wafer, as shown in FIG. 20A, the mask stage is moved with respect to an electron beam 602a having a fixed irradiation position. The group of divided chip patterns on the mask, which is to be irradiated with the electron beam 602a by one moving operation of the mask stage in an X direction shown in FIG. 20A, is called "divided chip patterns on a stripe". For example, the divided chip patterns M1, M2, and M3 exist on the same stripe. The mask stage moves in the direction of an arrow A such that the electron beam 602a moves across the respective stripes. In synchronism with this, the wafer stage is moved in the direction of an arrow B (FIG. 20B). When the electron beam is deflected by a deflector not shown in FIG. 18, the patterns are stitched to each other such that the bars among the divided patterns on the same stripe on the mask do not appear on the reduced pattern on the wafer 114. When the mask stage and wafer stage are moved up to the first pattern on each stripe, the patterns among the stripes are stitched to each other such that bars among the stripes on the mask do not appear on the reduced pattern on the wafer 114. The divided chip patterns M1, M2, . . . on the mask in FIG. 20A are reduced on the wafer 114 of FIG. 20B and are stitched to each other as patterns W1, W2, . . . . When the above operation is repeated, a plurality of device chip patterns 603, each consisting of the plurality of divided chip patterns and corresponding to one chip, are exposed onto the wafer 114.

The following problem, however, arises. That is, if the electron beam width is larger than the width of struts among the divided patterns on one stripe on the mask, the total dose varies, and the position of the transfer pattern is partially shifted. This problem will be described using a rectangular beam spot with reference to FIG. 21.

Referring to FIG. 21, reference numeral Bw1 denotes the width of a rectangular cross-sectional electron beam 602c on the mask 605; s1, the width of a strut between divided patterns within one stripe on the mask; and sw1, the length of a portion on the wafer which corresponds to a strut width s1 of the mask. Reference numerals M1 to M9 denote respective divided patterns on the mask; and W1 to W3, transfer patterns on the wafer that correspond to the divided patterns M1 to M3 of the mask.

Referring to FIG. 21, chart I schematically shows the distribution of an exposure dose on the wafer obtained when transferring the divided pattern M1 on the mask 605. In chart I, the axis of abscissa represents the positions of the transfer patterns W1, W2, and W3 on the wafer that correspond to the divided patterns M1, M2 and M3 on the mask during exposure, and the axis of ordinate represents the dose at each position. If the beam width on the mask is larger than the strut width, i.e., if Bw1>s1, the divided pattern M2 is partly exposed undesirably immediately before exposure of the pattern M1 is ended. Accordingly, as shown in chart I, the divided pattern M2 which should not be originally transferred is partly transferred to a position shifted from the transfer pattern W1 by sw1 within the transfer pattern W2 on the wafer. Similarly, when exposing the divided pattern M2, as shown in chart II, the divided pattern M3 is partly transferred to a position shifted from the transfer pattern W2 by sw1 within the transfer pattern W3 on the wafer. Chart IV shows the total dose at positions on the wafer, which correspond to stripe 1, when the divided patterns M1, M2, and M3 on stripe 1 are exposed. As is apparent from chart IV, when the beam width is larger than the strut width on the mask, the total dose varies on the mask, and the position of the transfer pattern is partly shifted, thus degrading the pattern precision.

SUMMARY OF THE INVENTION

The present invention has been made in view of the problems of the prior art, and has as its object to provide a charged beam projection mask with which variations in exposure dose and a positional error of the pattern projected on the mask are prevented to improve the pattern precision, a charged beam exposure apparatus using this mask, and a device manufacturing method suitable for manufacturing a device by this apparatus.

It is another object of the present invention to provide a charged beam projection mask with which the throughput is increased and the exposure precision is increased and which can be manufactured easily, a charged beam exposure apparatus using this mask, and a device manufacturing method suitable for manufacturing a device by this apparatus.

In order to achieve the above objects, the present invention has the following constitution. More specifically, in the projection mask, the charged beam exposure apparatus using this mask, and the device manufacturing method suitable for manufacturing a device by this apparatus according to the present invention, the width (scanning direction) of struts separating a plurality of divided patterns on the mask is larger than the beam width on the mask. When the strut width is set larger than the beam width on the mask in this manner, variations in exposure dose and a positional error of a pattern projected on the wafer are prevented to prevent degradation in pattern precision on the wafer.

Furthermore, in the present invention, the shape of part of each strut separating the plurality of regions matches the shape of the charged beam. In particular, when the charged beam has an arcuate spot, the strut portion separating the respective separated regions in one row on the mask is arcuate. Therefore, the distance between the divided regions decreases, and accordingly the mask area and mask stage moving distance decrease. As a result, the throughput is increased, the mask manufacture is facilitated, and the pattern precision is improved. It is desirable if the following means are also provided.

More specifically, if the radius of the arcuate cross-sectional electron beam and the radius of the arcuate strut are set to be equal to each other, a further increase in throughput can be obtained.

If the divided pattern width is set to be 0.9 times or less the diameter of the arcuate cross-sectional charged beam, the mask precision can be improved.

The divided pattern width and length are determined on the basis of a precision map experimentally obtained, so that pattern precision can be improved.

When the divided pattern widths are set to be almost equal to each other, the number of stripes is reduced, and the throughput is increased.

When the division boundary of divided patterns facing a strut bar has an arcuate shape, the throughput is increased.

When the radius of the division boundary of the arcuate divided patterns and the radius of an arcuate strut are set to be equal to each other, a further increase in throughput can be achieved.

In an exposure apparatus for sequentially exposing a mask, on which the pattern to be exposed is divided into a plurality of regions, with an arcuate cross-sectional charged beam, thereby projecting the pattern onto a photosensitive substrate, if the width of the charged beam on the mask is set smaller than the width of the struts separating the plurality of regions, and if a charged beam having a smaller spot diameter than the width of the struts is scanned in a direction along which the struts separating the plurality of regions are arranged, to sequentially expose the patterns, the precision of the transfer pattern is improved.

In particular, when a non-linear strut is arcuate to match the spot shape of the arcuate cross-sectional charged beam, in terms of an increase in throughput, the radius of the arc of the charged beam is preferably substantially equal to the radius of the arc of the struts, and the bending direction of the arc of the charged beam is preferably set to be in substantially the same direction as that of the non-linear strut.

In a method of manufacturing an electronic device by projecting a pattern onto a substrate by stitching a plurality of divided regions, if some of the plurality of regions form arcs, the throughput is increased and the device cost is reduced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3 shows the relationship between the strut portion between striped divided patterns and the arcuate cross-sectional beam of the first embodiment of the present invention;

FIG. 5 is a view showing a mask pattern portion shown in FIGS. 4A, 4B, and 4C in detail;

DETAILED DESCRIPTION OF THE PREFERRED EMBODIMENTS

The preferred embodiments of the present invention will be described with reference to the accompanying drawings.

First Embodiment

Figure 1:
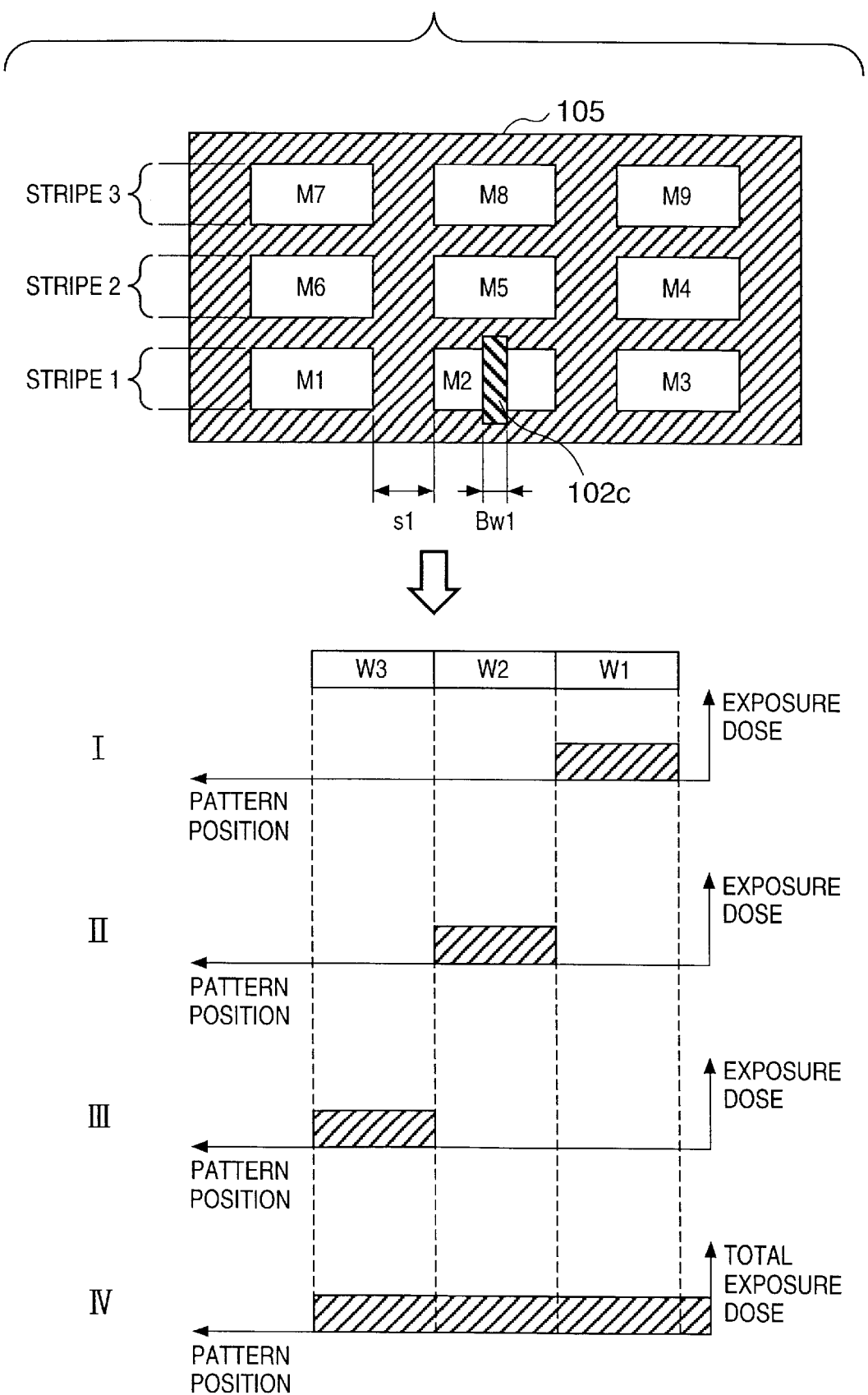
FIG. 1 is a view for explaining a charged beam mask according to the first embodiment of the present invention.

FIG. 1 is a view for explaining a charged beam mask according to the first embodiment of the present invention. Referring to FIG. 1, reference symbol Bw1 denotes the width of a rectangular cross-sectional electron beam 102c on a mask 105; and s1, the width of the strut among divided patterns in one stripe on the mask. Note that Bw1<s1. Reference symbols M1 to M9 denote the respective divided patterns on the mask; and W1 to W3, transfer patterns on the wafer that correspond to the divided patterns M1 to M3 of the mask.

Figure 20A:
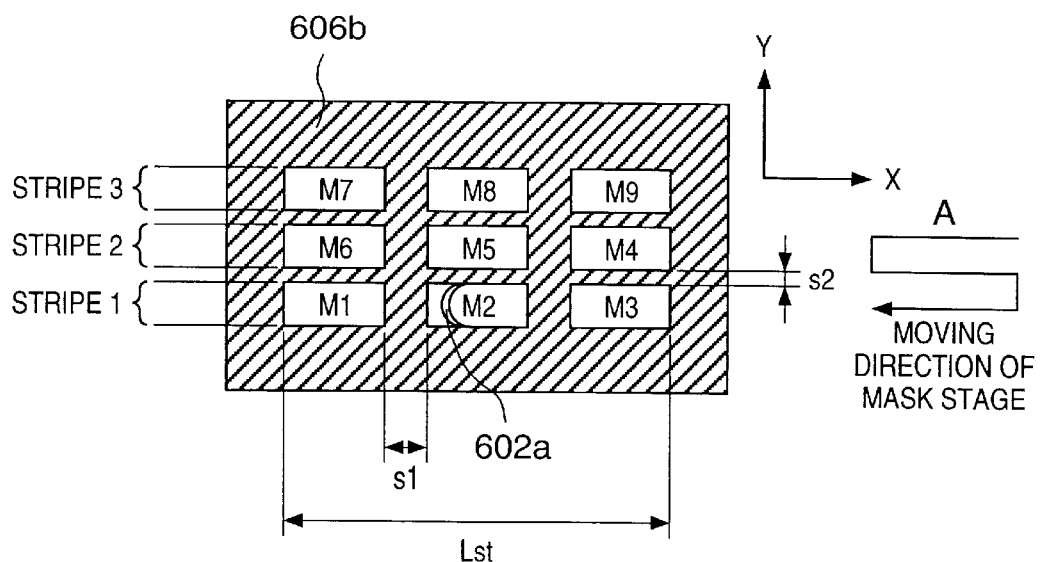
FIGS. 20A and 20B show a state wherein chip patterns on the conventional charged beam mask are exposed onto a wafer.
Figure 20B:
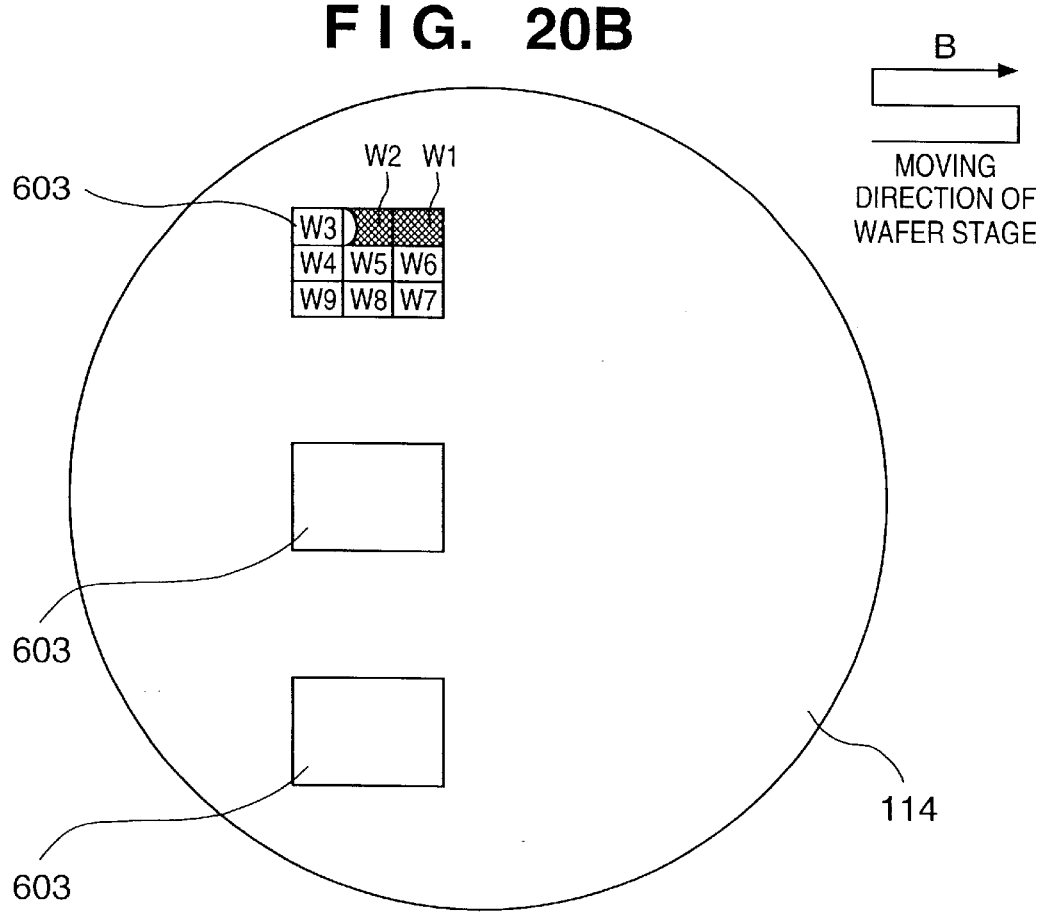

To expose the divided patterns M1 to M9 on the mask onto the wafer, as shown in FIGS. 20A and 20B, the mask stage is moved with respect to the electron beam having a fixed irradiation position. The mask stage moves in the direction of an arrow A such that the electron beam moves relatively across the respective stripes. In synchronism with this, the wafer stage is moved in the direction of an arrow B (opposite to the direction of arrow A). When the electron beam is deflected by a deflector, the patterns are stitched to each other such that the struts among the divided patterns on the same stripe on the mask do not appear on the wafer. When the mask stage and wafer stage are moved up to the first pattern on each stripe, the patterns among the stripes are stitched to each other such that struts among the stripes on the mask do not appear on the wafer. The divided patterns M1, M2, . . . on the mask are reduced on the wafer and are stitched to each other as transfer patterns W1, W2, . . . . When the above operation is repeated, a plurality of device chip patterns, each consisting of the plurality of divided chip patterns and corresponding to one chip, are exposed onto the wafer.

Referring to FIG. 1, chart I schematically shows the distribution of an exposure dose on the wafer when transferring the divided pattern M1 on the mask 105. In chart I, the axis of abscissa represents the positions of the transfer patterns W1, W2, and W3 on the wafer that correspond to the divided patterns M1, M2 and M3 on the mask during exposure, and the axis of ordinate represents the dose at each position.

Figure 21:
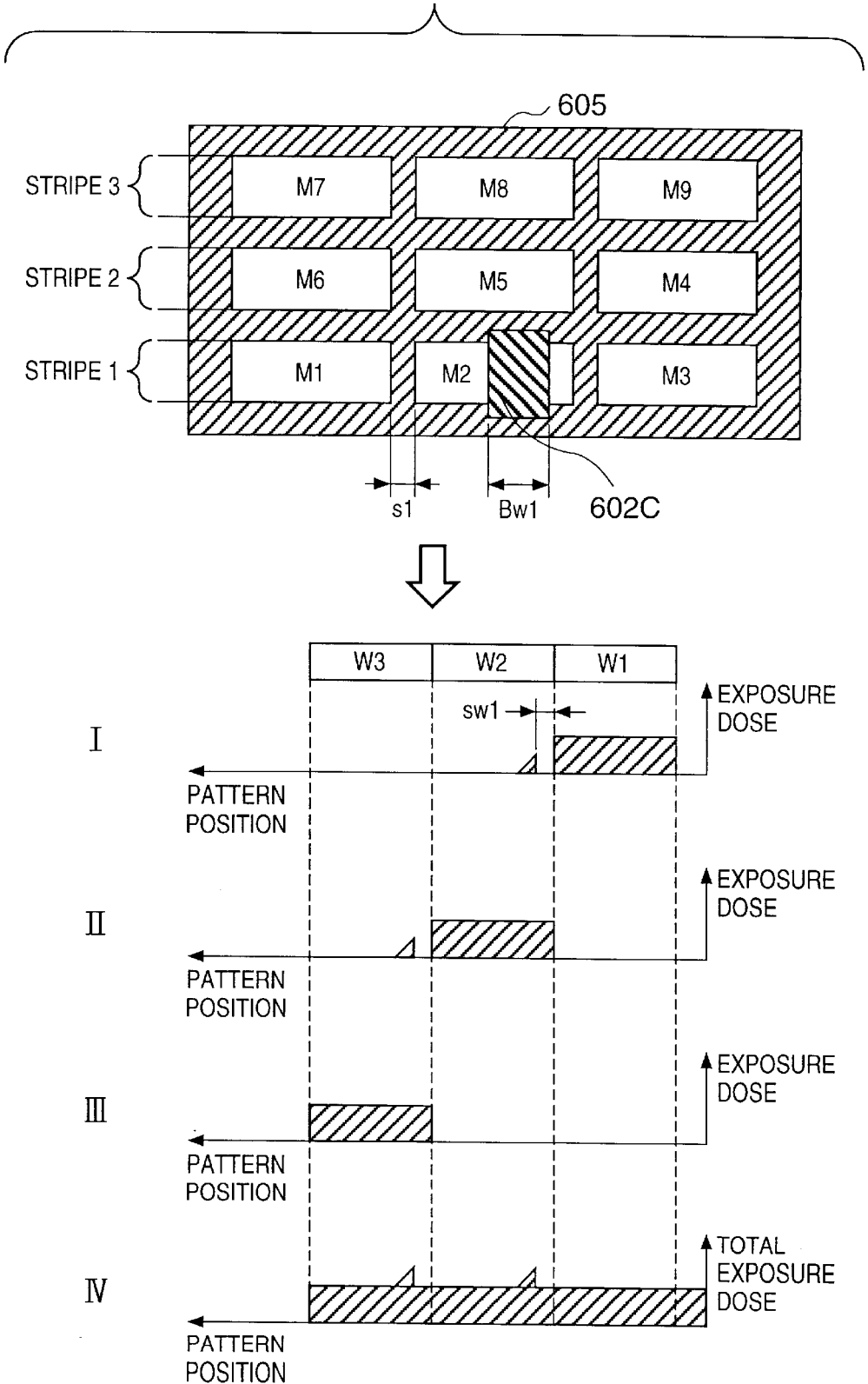
FIG. 21 is a view for explaining problems in the conventional charged beam mask.

In this embodiment, since the beam width on the mask is smaller than the strut width (Bw1<s1), as shown in chart I, even immediately before exposure of the pattern M1 is ended, partial transfer of the divided pattern M2 as shown in FIG. 21 does not occur. Similarly, also in chart II of FIG. 1, partial transfer of the divided pattern M3 as shown in FIG. 21 II does not occur. Therefore, the total dose for the positions on the wafer of the divided patterns M1, M2, and M3 obtained when the divided patterns M1, M2, and M3 on the stripe 1 are transferred are constant regardless of the pattern position, as shown in chart IV of FIG. 1, and a positional error of the pattern as shown in FIG. 21 does not occur. As is apparent from the above description, variations in total dose and a positional error of the transfer pattern on the wafer can be prevented by decreasing the beam width Bw1 to be smaller than the strut width s1, thereby preventing degradation in pattern quality on the wafer.

Figure 2:
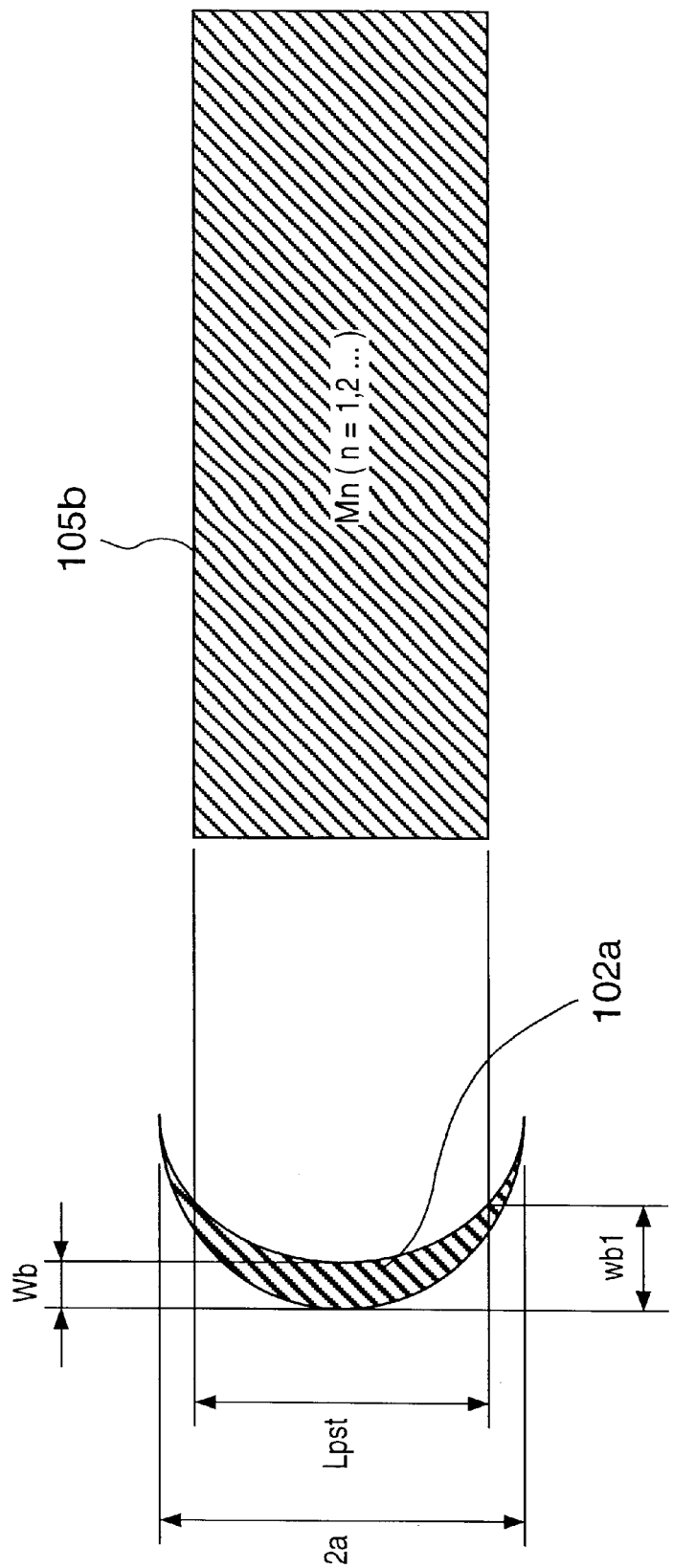
FIG. 2 is a view for explaining the spot shape of an arcuate cross-sectional beam used for the divided mask pattern of the present invention.

In this embodiment, the beam has a rectangular spot. To apply the present invention to an arcuate cross-sectional beam, the following measure may be taken. More specifically, when using an arcuate cross-sectional beam 102a as shown in FIG. 2, if the strut width is made larger than a width wb1 occupied by the arcuate cross-sectional beam (diameter: 2a) shown in FIG. 2 within Lpst (the width of a divided pattern thin film portion Mn (n=1, 2, . . . )), then the above description concerning the rectangular cross-sectional beam applies to the arcuate cross-sectional beam as well. Variations in exposure dose and a positional error of the transfer pattern on the wafer can thus be prevented. As a result, degradation in pattern quality on the wafer can be prevented.

Second Embodiment

In the second embodiment, an arcuate cross-sectional beam is used as the exposure charged beam of an exposure apparatus. When using the arcuate cross-sectional beam, as described in the first embodiment as well, if a beam width wb1 of FIG. 2 is made smaller than a strut width s1 of FIG. 20, variations in dose and a positional error of the transfer pattern on the wafer are prevented, thereby preventing degradation in pattern quality on the wafer. In this case, however, if a length 2a of the arcuate cross-sectional beam in FIG. 2 is increased, Wb1 also increases accordingly, and the length of s1 that must be larger than Wb1 also increases accordingly (see FIG. 3). As a result, the distance through which the mask stage must move in order to expose patterns on one stripe increases, and the throughput may be undesirably decreased. When the strut width s1 in the stripe increases, the mask area increases, and the manufacture of the mask tends to be difficult. Furthermore, when the strut width s1 in the stripe increases, the deflection width of the beam deflected by the deflector to stitch divided patterns on the wafer also increases, leading to degradation in exposure precision.

In the second embodiment, a charged beam projection mask, which is suitable for an arcuate cross-sectional beam exposure apparatus, in which throughput and exposure precision are increased, and which can be manufactured easily is proposed.

Figure 4A:
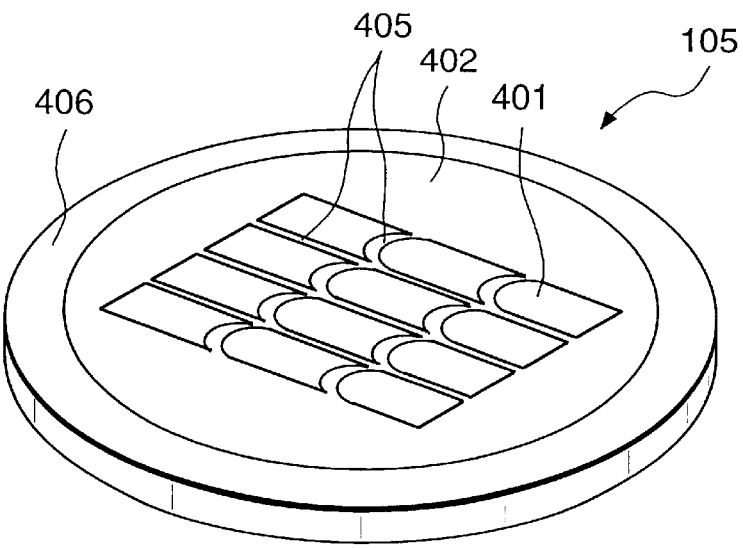
FIG. 4A is a perspective view of a charged beam mask according to the second embodiment of the present invention.
Figure 4B:
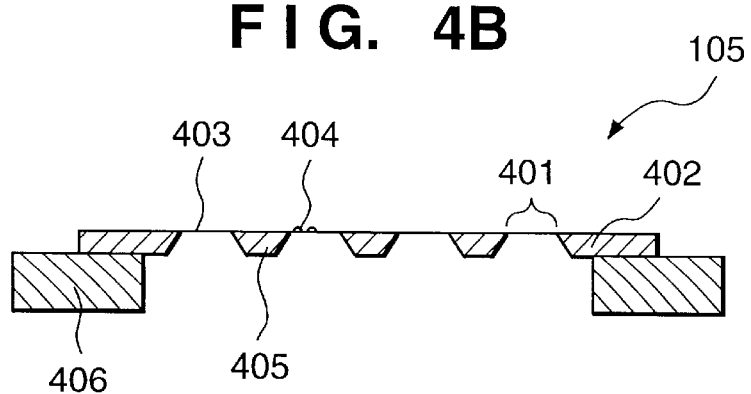
FIG. 4B is a sectional view of the charged beam mask according to the second embodiment of the present invention.
Figure 4C:
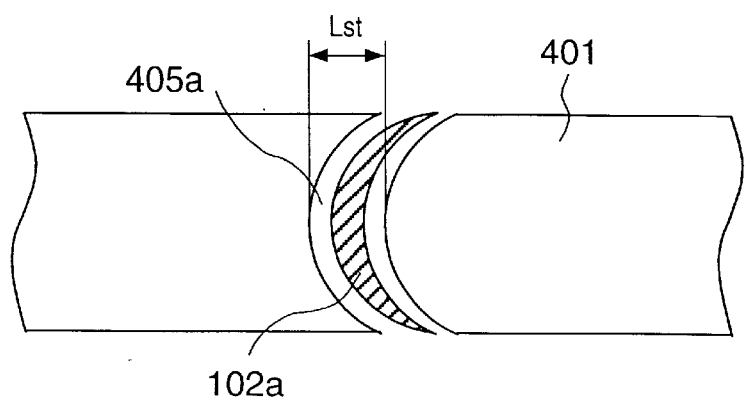
FIG. 4C is a view showing the shape of the strut portion in a stripe as the characteristic portion of the second embodiment of the present invention.
Figure 18:
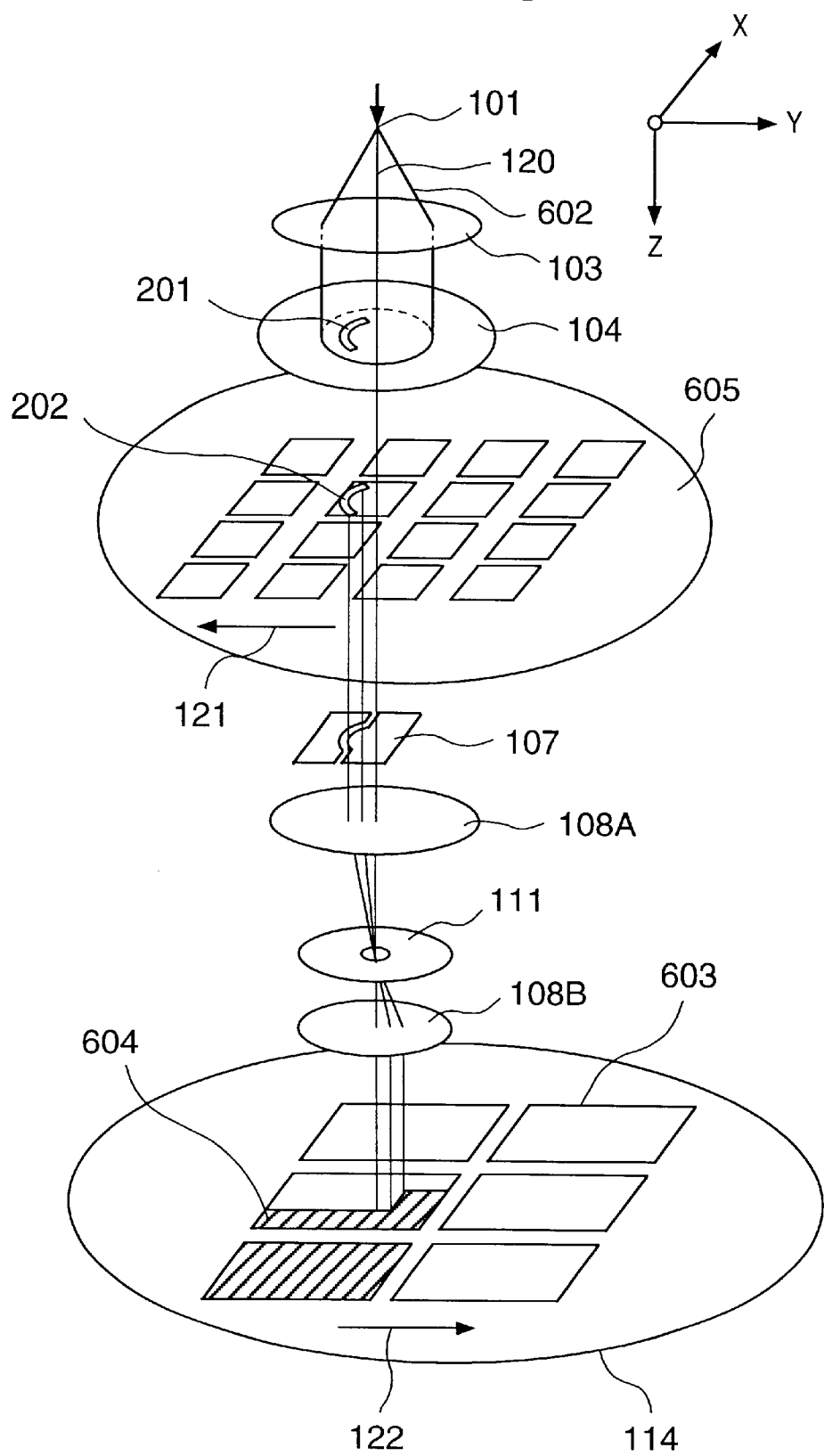
FIG. 18 is a view showing the arrangement of an exposure apparatus using a conventional charged beam mask.
Figure 19A:
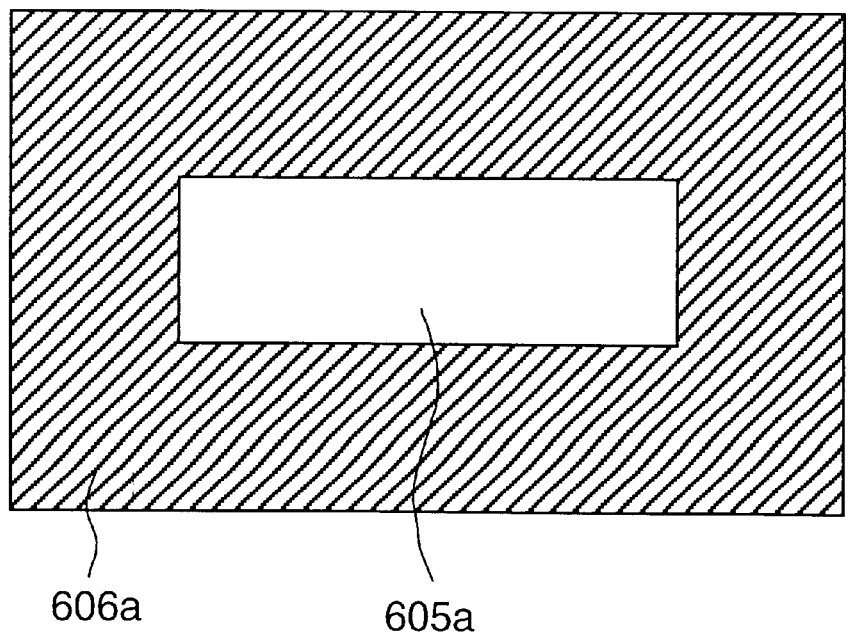
FIGS. 19A and 19B are plan views showing conventional charged beam masks.
Figure 19B:
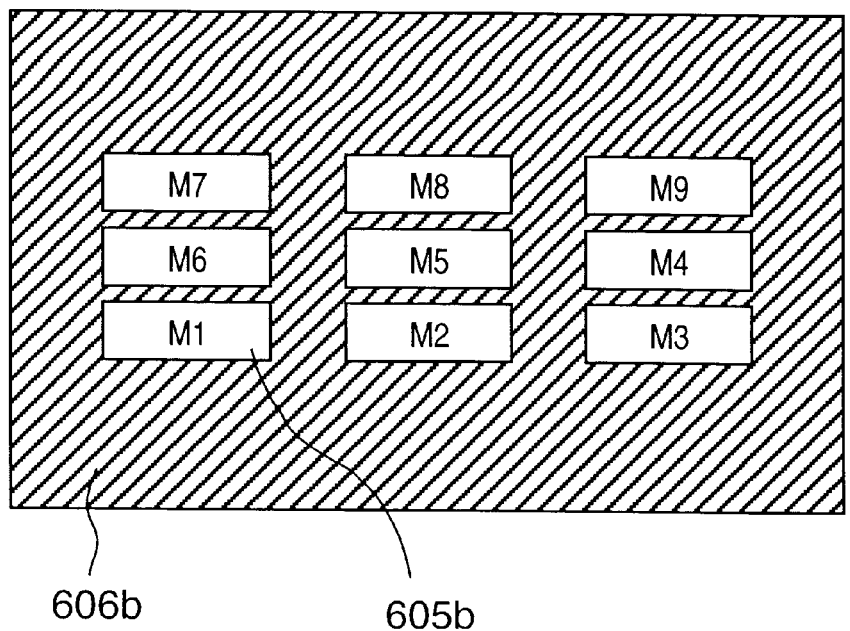

FIGS. 4A, 4B, and 4C show a charged beam mask according to the second embodiment of the present invention, in which FIG. 4A is a perspective view, FIG. 4B is a sectional view, and FIG. 4C shows the shape of the strut portion in a stripe, which is the characteristic part of the second embodiment. Referring to FIGS. 4A and 4B, reference numeral 401 denotes a mask pattern region; 402, a mask substrate; 403, an electron beam transmitting membrane (low-scattering body); 404, an electron beam scattering body (high-scattering body); 405, a reinforcing strut; and 406, a mask frame. To form this mask, for example, tungsten (W) is patterned for 0.02 μm as the electron beam scattering body 404 on the electron beam transmitting membrane 403 made of 0.15-μm thick SiN formed on the mask substrate 402 made of 2-mm thick silicon. Since this silicon wafer is difficult to handle independently, it is fixed to the mask frame 406 like one used in X-ray exposure. In this embodiment and the following embodiments, the charged beam mask is used in the exposure apparatus shown in FIG. 18, and a description thereof will be omitted.

In this charged beam mask 105, as shown in FIG. 4C, the shape of a strut portion 405a matches that of an arcuate cross-sectional electron beam 102a. This can decrease a strut width Lst in the stripe more than in the first embodiment shown in FIG. 3. The moving distance of the mask stage in the direction of the stripe is thus shortened, realizing an increase in throughput, facilitation of the manufacture, and improvement of the pattern precision.

FIG. 5 shows the mask pattern portion shown in FIGS. 4A, 4B, and 4C in detail. An example of a procedure of designing pattern arrangement of the mask shown in FIG. 5 will be described by using an arcuate cross-sectional beam having a radius a on the mask.

Referring to FIG. 5, reference symbols Δsx and Δsy respectively indicate spaces in the X and Y directions that aim at making the positional precision of the strut 405 lenient, improving precision of pattern stitching during exposure, and the like. The electron beam scattering body 404 described above is arranged at the spaces Δsx and Δsy. A width Lpst and length Llim of the mask pattern region (thin film portion) 403 where divided patterns 401a are formed must be respectively equal to predetermined values of Lpst_lim and Llim_lim or less.

Similarly, the strut width Lst in the stripe and a strut width s2 among stripes must be respectively equal to predetermined values of Lst_lim and s2_lim or less. These predetermined values can be obtained by calculation or experiments.

Figure 6:
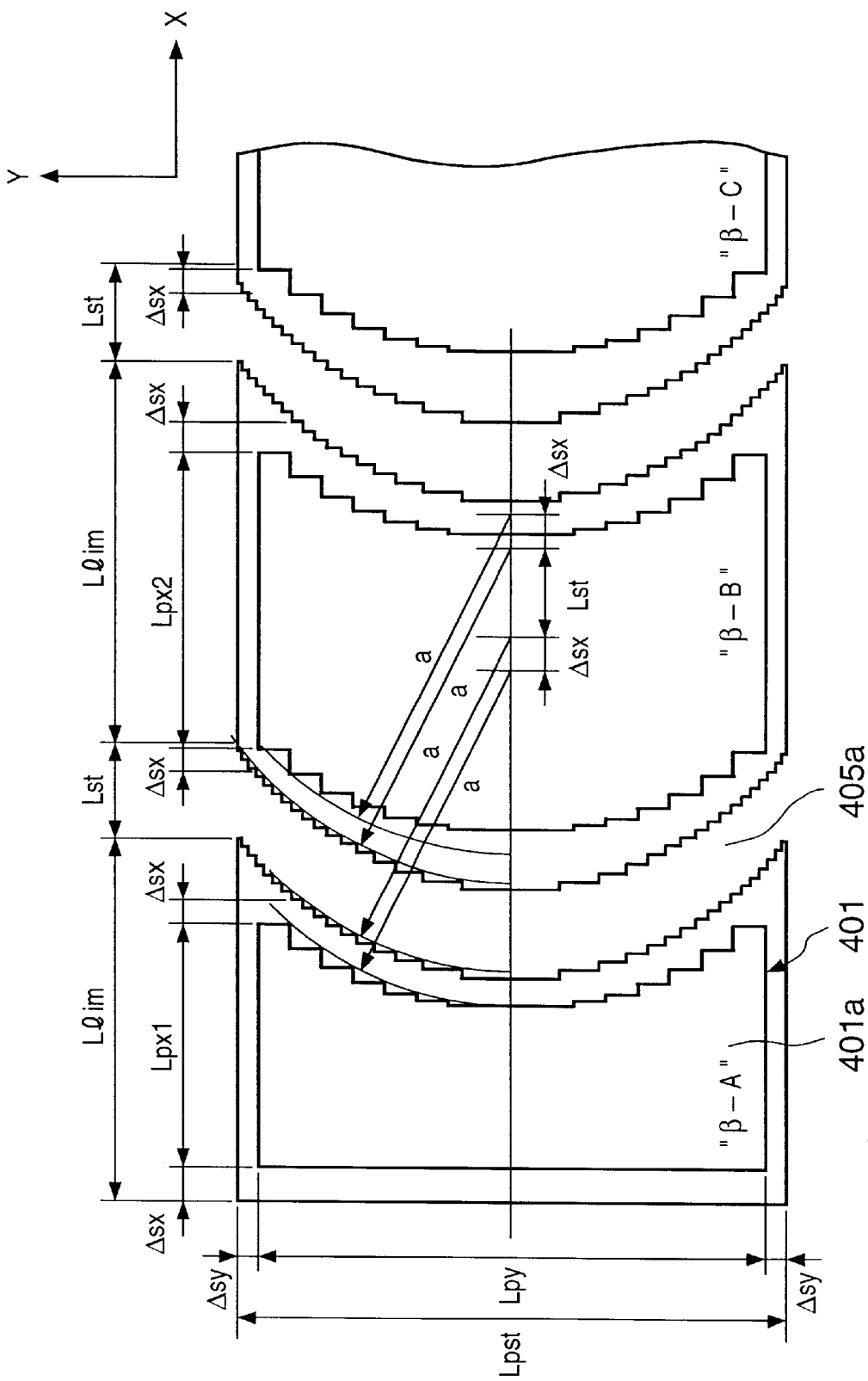
FIG. 6 is an enlarged view of a portion "C" of FIG. 5.

In practice, the shape of the strut portion 405a in the stripe and the boundary of the divided patterns 401a in the stripe that face the strut portion 405a in FIG. 5 are arcuate stepwise, as shown in FIG. 6. FIG. 6 is an enlarged view of a portion "C" (FIG. 5) near the boundary of the divided patterns 401a.

An example of how to determine the stepped shapes of the strut and divided pattern in the stripe will be described.

Figure 7:
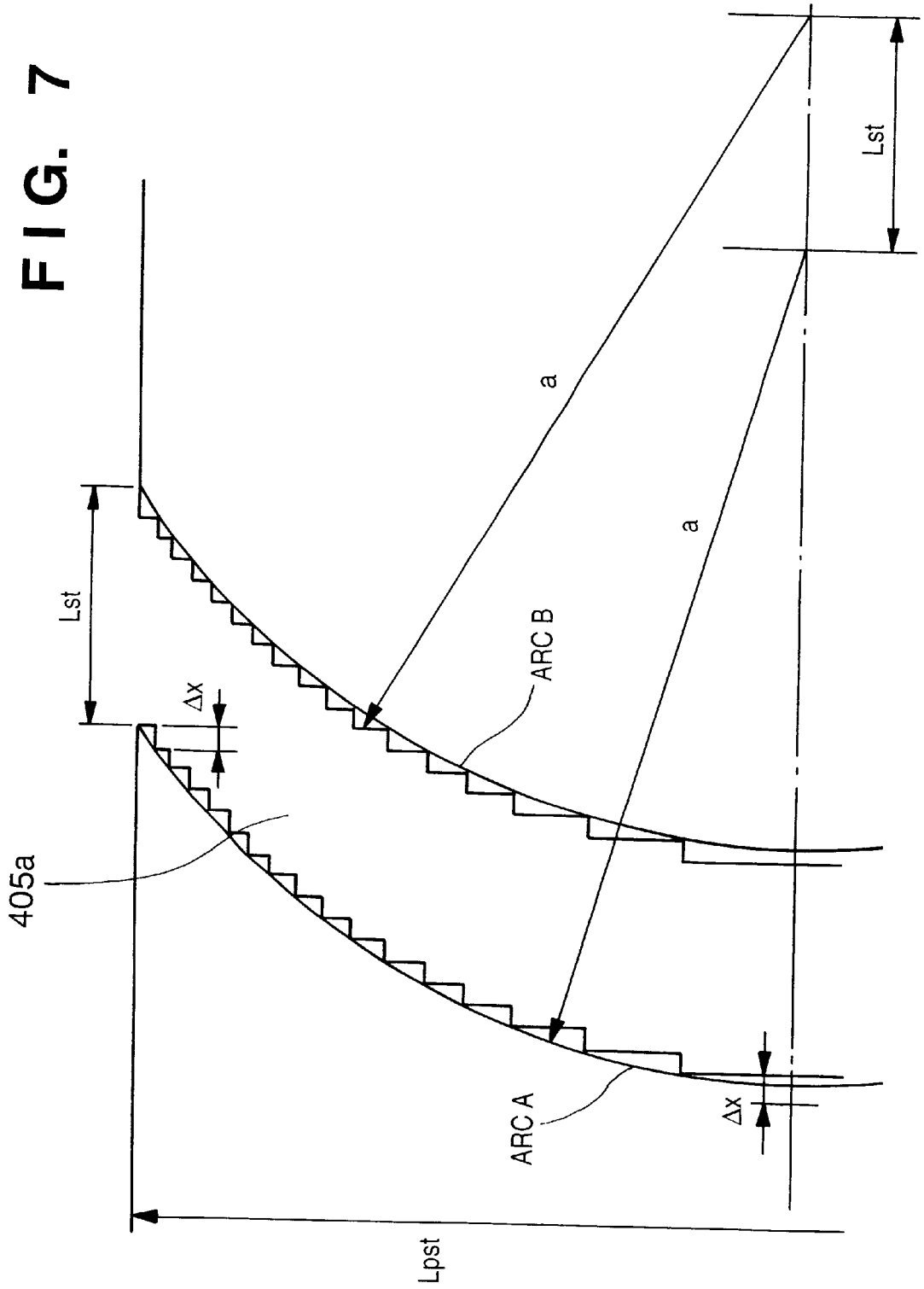
FIG. 7 is a view for explaining an example of how to determine the shape of the strut portion in the stripe shown in FIG. 5.

(1) Stepped Shape of Strut Portion in Stripe: An example of determining the stepped shape of the strut will be described with reference to FIG. 7. Referring to FIG. 7, the radii a of arcs A and B are the radii of the arcuate cross-sectional beams to be used. Although it is not always necessary to set the radii of the arcs A and B of FIG. 7 to be equal to those of the arcuate cross-sectional beams to be used, if they are so set, the distance through which the stage should move in the direction of a stripe can be small, which is advantageous in terms of throughput. As shown in FIG. 7, the steps of the strut were determined to have equidistant widths Δx which are in contact with these arcs.

Figure 8:
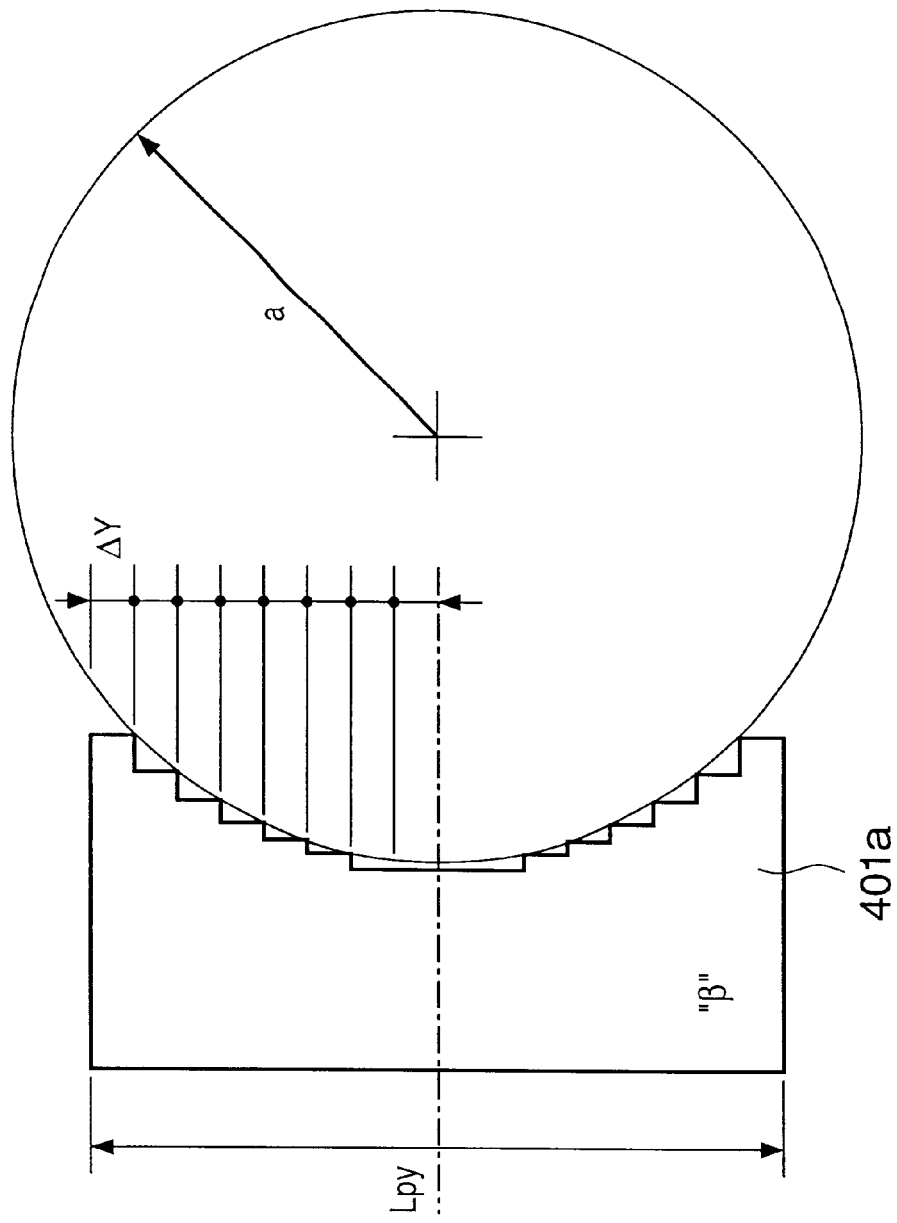
FIG. 8 is a view for explaining an example of how to determine the shape of a boundary in the stripe shown in FIG. 5 that faces the strut portion.

(2) Stepped Shape of Divided Pattern: An example of how to determine the stepped shape of the boundary of the divided patterns in the stripe that faces the strut portion will be described with reference to FIG. 8. Referring to FIG. 8, the radius a of the circle is the radius of the arcuate cross-sectional beam to be used. Although it is not always necessary to set the radius of the circle of FIG. 8 to be equal to that of the arcuate cross-sectional beam to be used, if it is so set, the distance through which the stage should move in the direction of the stripe can be small. This improves the throughput. As shown in FIG. 8, the steps were determined to have widths ΔY which are in contact with this circle and almost equidistant in the Y direction.

The strut width Lst in the stripe shown in FIG. 6 is equal to the distance connecting the centers of the arcs A and B of FIG. 7, and is a larger one of the value of Lst_lim described above and an arcuate cross-sectional beam width Wb (see FIG. 2).

Figure 9:
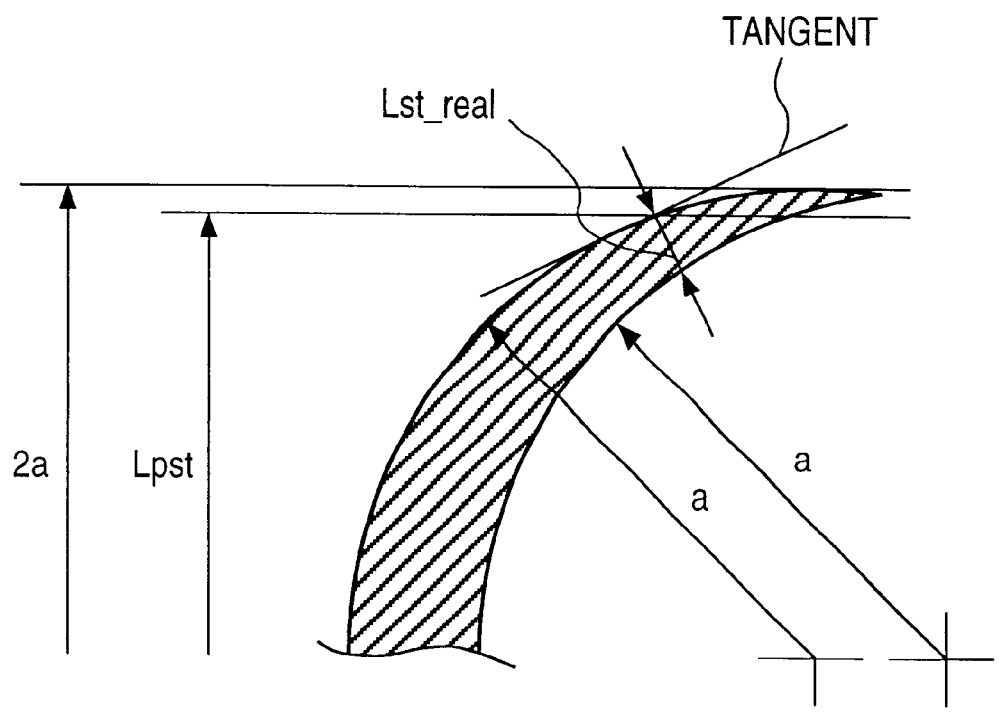
FIG. 9 is a view for explaining how to determine a width Lpy of the divided patterns shown in FIG. 6.

A width Lpy of the divided pattern 401a shown in FIG. 6 is determined by Lpst-2·Δsy. Regarding the width Lpst of the mask pattern regions 401, as shown in FIG. 9, the closer it is to the length 2a of the arcuate cross-sectional beam, the smaller the substantial width Lst_real of the strut, and accordingly 2a×0.9> Lpst is desirable from the point of mechanical strength.

As the divided pattern length of each stripe, three types were prepared, i.e., lengths Lpx1 and Lpx3 of divided patterns present at the two ends of the stripe, and a length Lpx2 of divided patterns other than them, as shown in FIG. 5. An example of how to determine these divided pattern lengths Lpx1, Lpx2, and Lpx3 will be described.

Lpx1 and Lpx2 are determined as values with which the distance between circles each having a radius a, with which the steps of the divided pattern and the steps of the strut in the stripe are respectively in contact, in the direction of the stripe (X direction) becomes Δsx, as shown in FIG. 6. Lpx3 can also be determined similarly, although not shown in FIG. 6.

Figure 10:
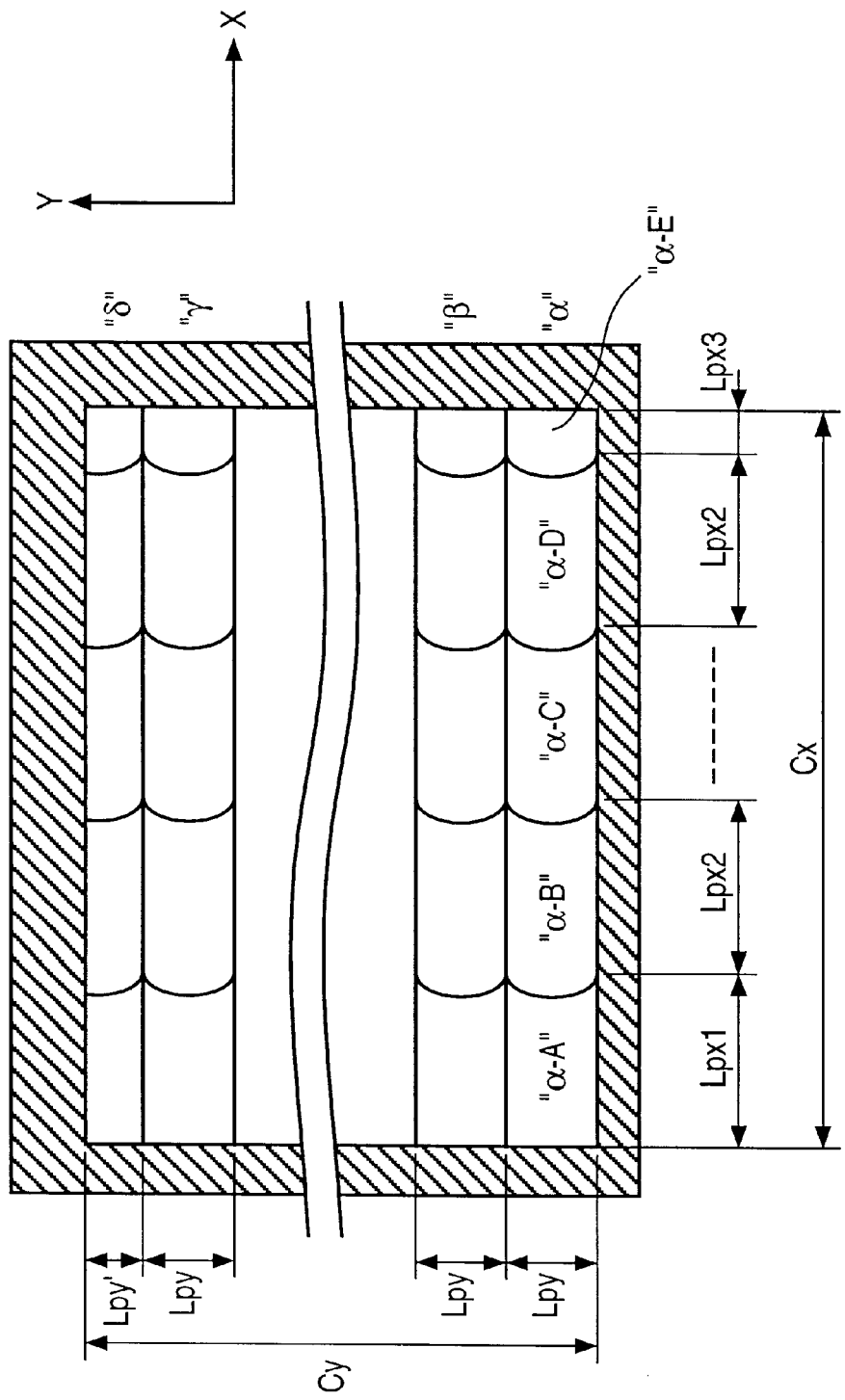
FIG. 10 is a view explaining an example of dividing a chip pattern in the second embodiment of the present invention.

FIG. 10 explains an example in which chip patterns are divided by using these determined Lpy, Lpx1, Lpx2, and Lpx3. Reference symbol Cx denotes the length of the chip patterns on the mask; and Cy, the width of the chip patterns on the mask. Symbols "α" to "δ" respectively denote patterns formed on one stripe by division. In the Y direction, the patterns are divided to satisfy Cy=m×Lpy+Lpy' (m: a natural number, Lpy'<Lpy). In the X direction, the patterns are divided to satisfy Cx=Lpx1+n×Lpx2+Lpx3 (n: a natural number).

Numerical examples of the electron beam mask of this embodiment will be shown.

When the length Cx of the chip pattern on the mask is 80 mm and the width Cy of the chip pattern on the mask is 168 mm, assume that the radius a of the arcuate cross-sectional beam is 14 mm, the width Lpy of the divided pattern is 20 mm, the length Lpx1 of the divided pattern is 7 mm, the length Lpx2 of the divided pattern is 7 mm, the length Lpx3 of the divided pattern is 0 mm, the strut width Lst in the stripe is 3 mm, and the space Δsx satisfies Δsx=Δsy=50 μm. The throughput value [number of 8-inch wafers/hour] is as in the following table (resist sensitivity=2 μC/cm$^2$):

| Beam Current [μA] | When strut in stripe is arcuate (second embodiment) | When strut in stripe is rectangular (first embodiment) |
| --- | --- | --- |
| 5 | 19 [wafers/hour] | 14 [wafers/hour] |
| 10 | 31 [wafers/hour] | 24 [wafers/hour] |

As is apparent from this table, when the strut in the stripe is arcuate, an increase in throughput of as high as about 30% can be obtained. Regarding the sum of the strut widths in one stripe, when it is about 180 mm with the rectangular strut in the first embodiment, it is about 72 mm with the arcuate strut in the second embodiment, and the mask pattern width of the arcuate strut becomes ½ or less than that obtained in the first embodiment. As a result, the mask area can be reduced to facilitate mask fabrication. This also leads to an improvement in exposure pattern precision.

In this embodiment, Llim, Δsx, Δsy, and Lst of FIG. 5 are set to be constant in the respective divided patterns. However, this is not always necessary.

The sizes of Llim and Lpx can be changed in units of divided patterns. Alternatively, a precision map may be obtained experimentally in advance, and the divided pattern size of a portion having poor precision may be reduced on the basis of the precision map information, so that the exposure precision can be improved.

In this embodiment, the values of ΔY of FIG. 8 used for pattern division are set almost equal to each other to facilitate pattern processing. However, this is not always necessary.

A strut width s2 in a stripe is determined to be s2_lim or more so as not to irradiate the divided patterns of a stripe adjacent to a certain stripe under irradiation.

Figure 11B:
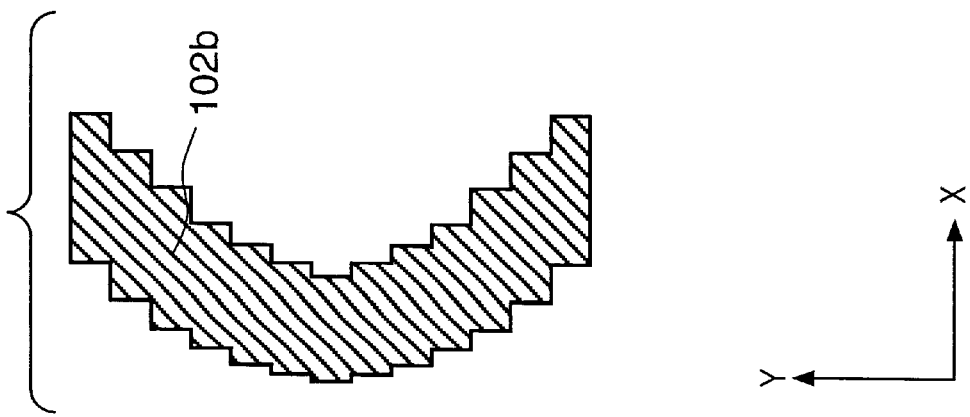
FIGS. 11A and 11B are views for explaining modifications of the spot shape of an electron beam used in the charged beam mask according to the second embodiment of the present invention.
Figure 11A:
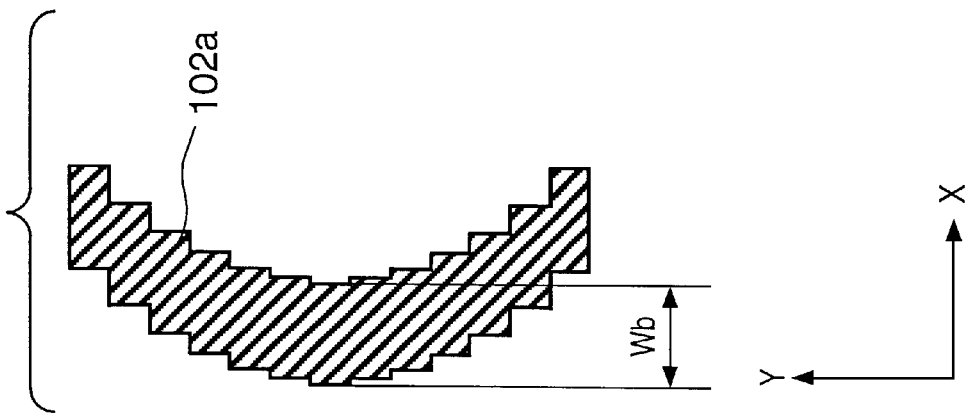
Figure 12:
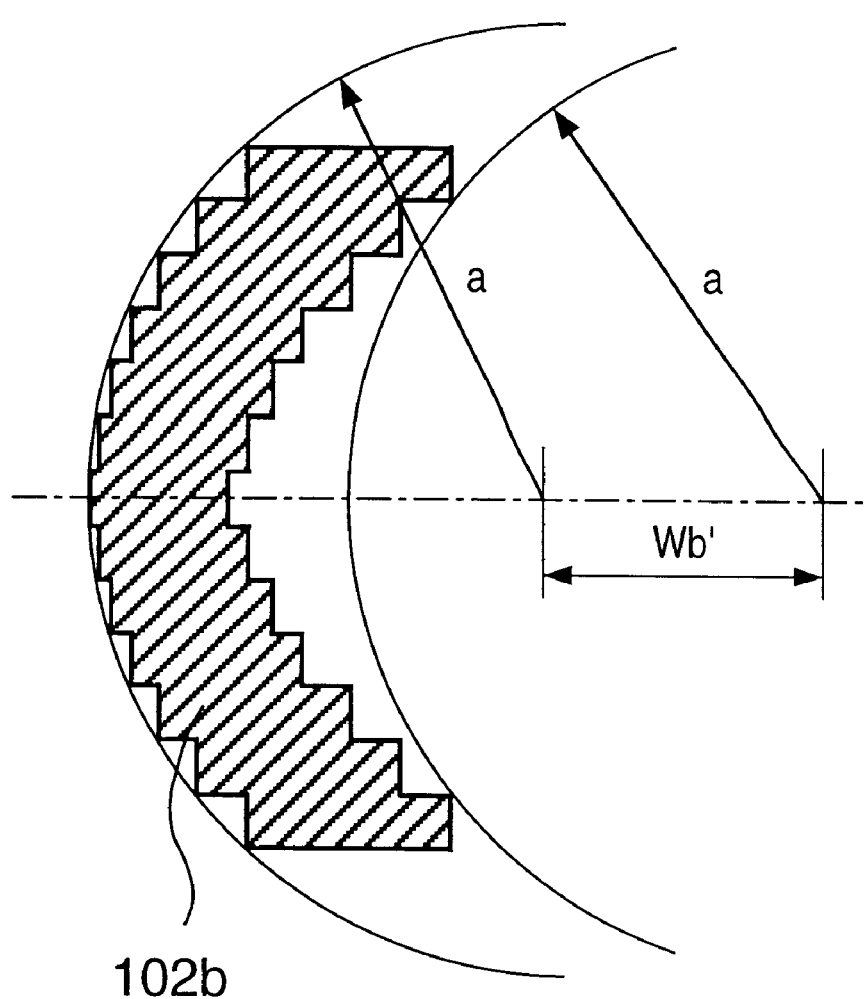
FIG. 12 is a view for explaining a mask design procedure when using the electron beam shown in FIG. 11B.

The shape of the beam spot of the arcuate cross-sectional beam to be used is sometimes intentionally changed. Such a case will be described with reference to FIGS. 11A and 11B, and FIG. 12. In FIGS. 11A and 11B, in order to correct the nonuniformity of the irradiation electron beam strength, the beam width (X-direction width), which is a constant value Wb regardless of the position in the Y direction as shown in FIG. 11A, is changed depending on the Y-direction position, as shown in FIG. 11B. With the arcuate cross-sectional beam as shown in FIG. 11B, if, for example, a center-to-center distance Wb' between the two a-radius circles with which this beam is in contact is defined again as the width of the arcuate beam, the mask design procedure described above can be used directly.

Figure 13:
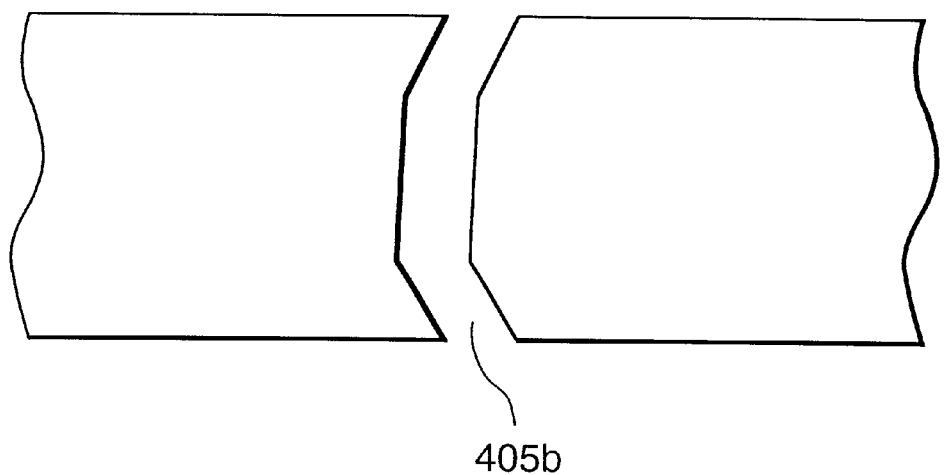
FIG. 13 is a view showing a modification of the shape of the strut portion in the stripe of the charged beam mask according to the present invention.

The second embodiment exemplifies a case wherein the strut forms steps in contact with an arc so as to match the arcuate cross-sectional beam. However, the strut does not always necessarily have this stepped shape. For example, it is apparent that, even if a polygonal strut 405b as shown in FIG. 13 is employed in place of the stepped strut, when the charged beam has an arcuate spot, the strut width among the divided patterns is effectively reduced. It suffices as far as the boundary portion if the divided patterns has a shape almost matching the arcuate cross-sectional beam to be used.

Third Embodiment

Figure 14:
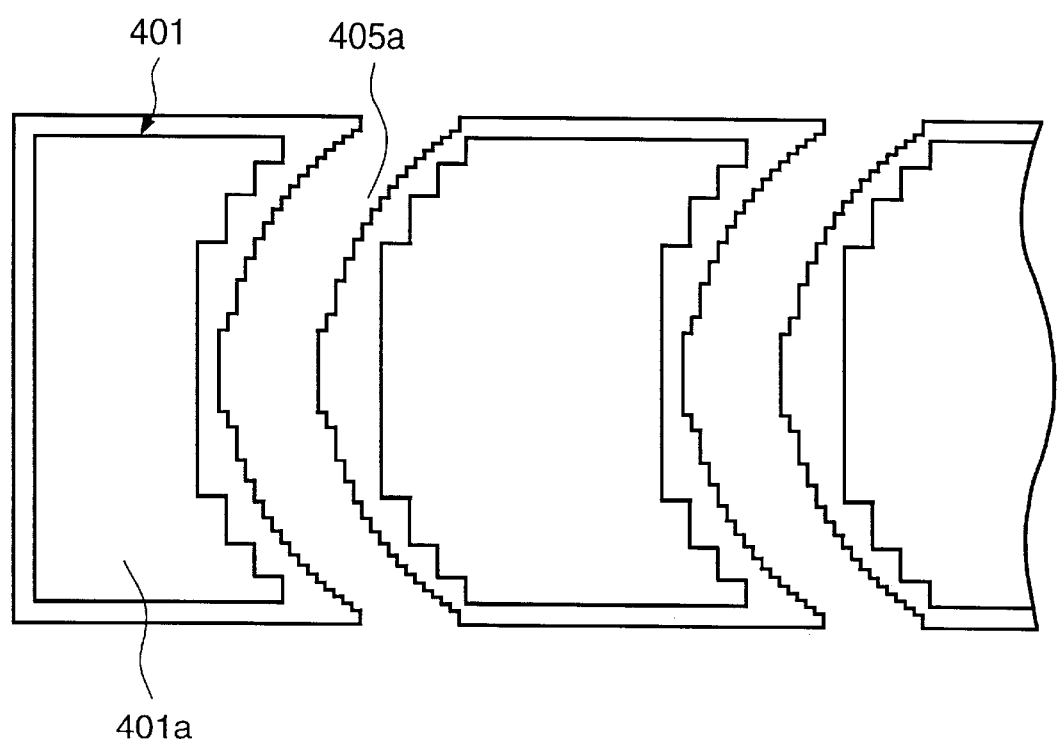
FIG. 14 is an enlarged view showing the divided patterns in the stripe in a charged beam mask according to the third embodiment of the present invention.
Figure 15:
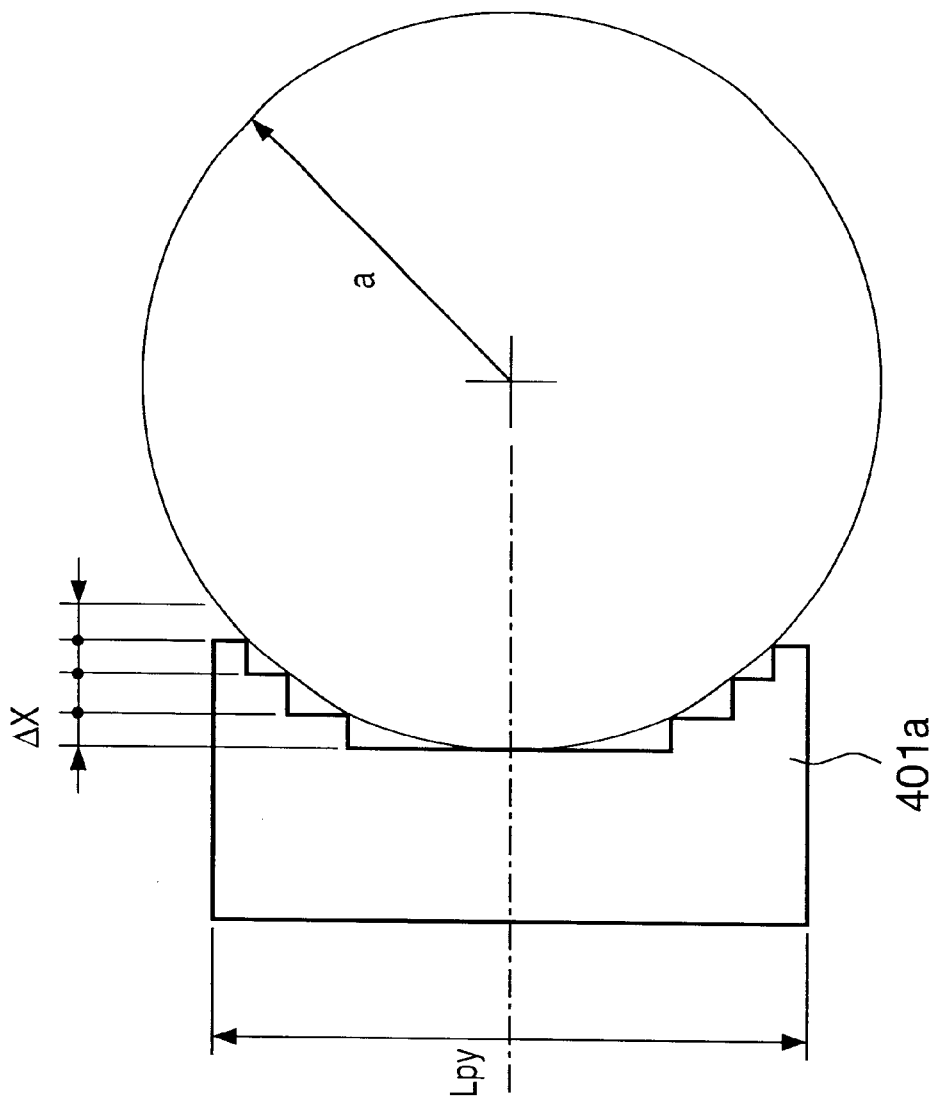
FIG. 15 is a view for explaining an example of how to determine the shape of a boundary in the stripe shown in FIG. 14 that faces the strut portion.

FIG. 14 is an enlarged view showing divided patterns in a stripe of a charged beam mask according to the third embodiment of the present invention. In this embodiment, the boundary of the divided patterns in a stripe shown in FIG. 14 that face the strut portion forms steps, as shown in FIG. 15, which are in contact with a circle having a radius a and which have widths ΔX almost equidistant in the X direction. In FIG. 15, the radius a of the circle corresponds to the radius of the arcuate-beam spot to be used. Although it is not always necessary to set the radius of the circle of FIG. 15 to be equal to the radius of the arcuate cross-sectional beam to be used, if it is so set, the distance through which the stage should move in the stripe direction can be small. This improves the throughput. Since the boundary is formed to have steps with widths ΔX that are almost equidistant in the X direction, the number of steps of the boundary becomes smaller than in the second embodiment wherein the boundary steps are equidistant in the Y direction, and stitching of the patterns can be easily checked.

In this embodiment, the widths ΔX used for pattern division in FIG. 15 are set almost equal to each other to facilitate pattern processing. However, this is not always necessary.

Fourth Embodiment

Figure 16:
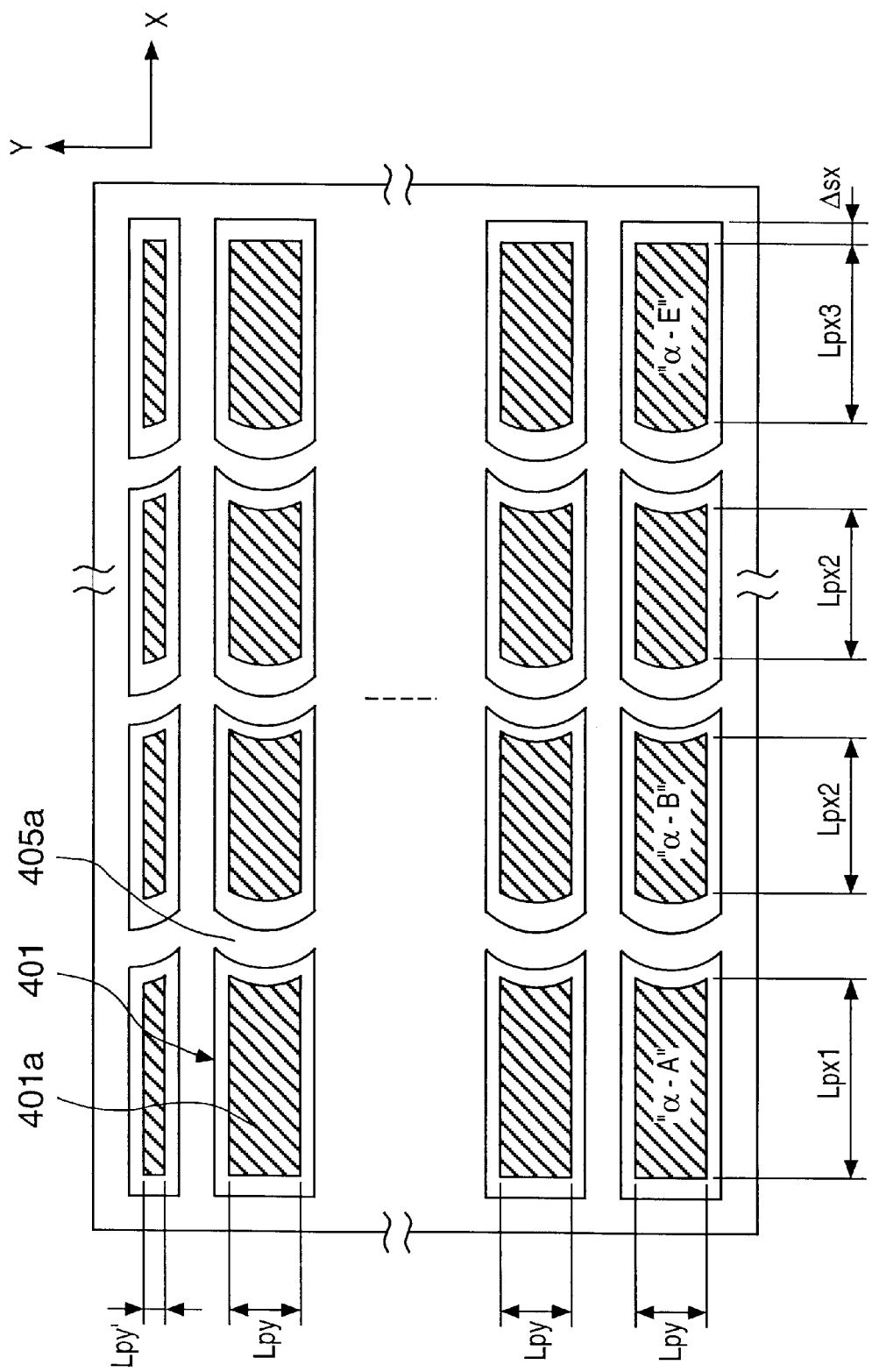
FIG. 16 is a plan view showing a charged beam mask according to the fourth embodiment of the present invention.

FIG. 16 is a plan view showing a charged beam mask according to the fourth embodiment of the present invention. In the fourth embodiment, a width Lpst of a thin film portion (mask pattern region) constituting a stripe "δ", when divided patterns are present only partially (Lpy') in FIG. 5 showing the second embodiment, is set smaller from Lpy+2·Δsy to Lpy'+2·Δsy. The length of a portion "E" in FIG. 5 is also reduced in accordance with a length Lpx3 where the patterns are actually present. This increases the strength of the mask structure to improve the pattern precision.

Fifth Embodiment

Figure 17:
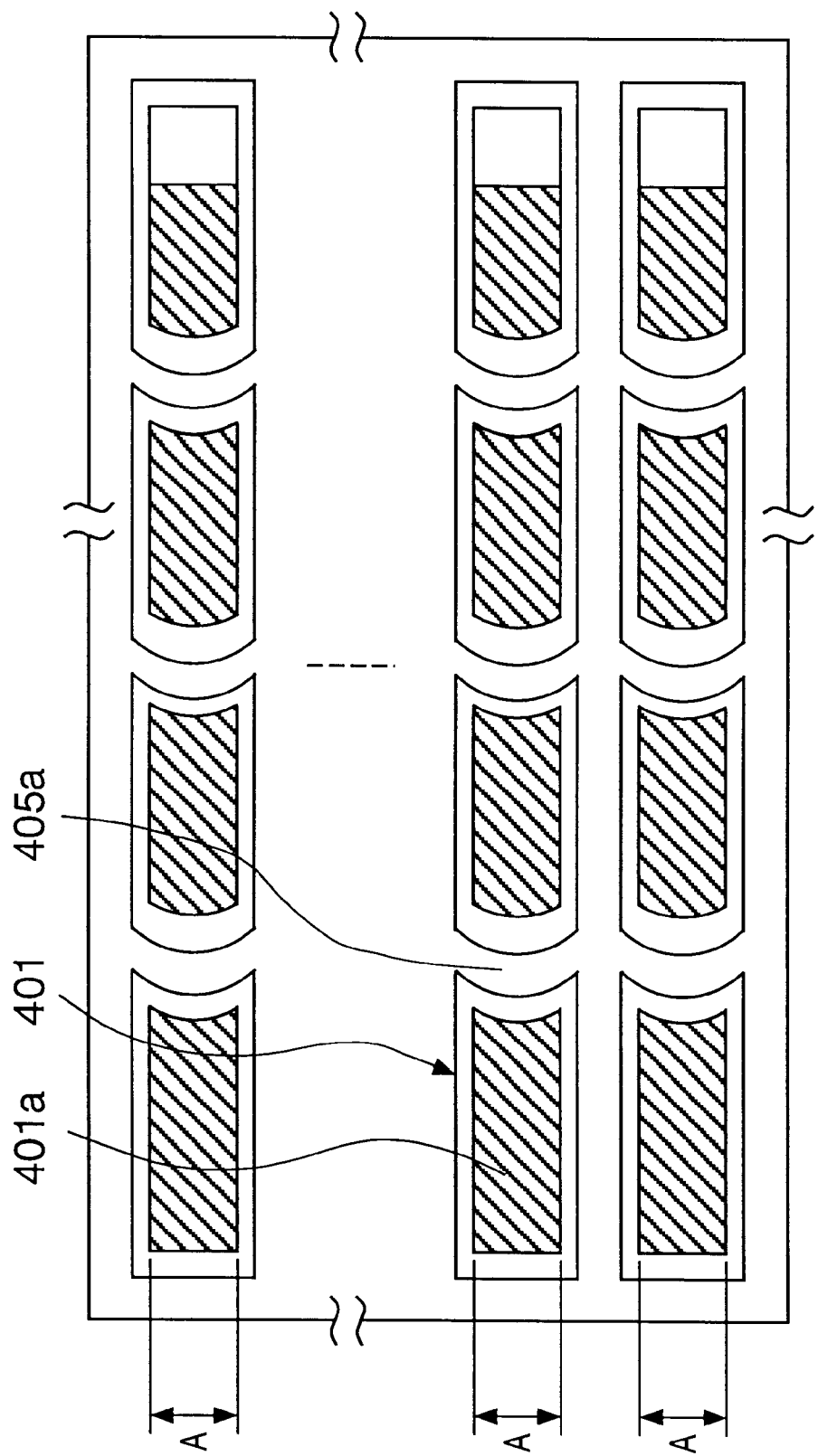
FIG. 17 is a plan view showing a charged beam mask according to the fifth embodiment of the present invention.

FIG. 17 is a plan view showing a charged beam mask according to the fifth embodiment of the present invention. In the fifth embodiment, Lpy' in FIG. 5 showing the second embodiment is equally distributed among other stripes to reduce the number of stripes to be smaller than that in the second embodiment. In FIG. 17, a relationship Cy=m·A (m: a natural number) is established concerning the width Cy of the chip patterns on the mask. This reduces the cumulative moving distance, necessary for exposing one chip, of the stage in the direction of stripes, to further increase the throughput.

The projection mask, the charged beam exposure apparatus using this mask, and a device manufacturing method using the apparatus, according to the present invention have the following effects.

(1) In the projection mask, the width of struts separating the divided patterns in the stripe is larger than the beam width on the mask. Hence, variations in exposure dose and a positional error of the pattern projected on the wafer can be prevented to prevent degradation in pattern precision on the wafer.

(2) In the projection mask, the shape of each strut separating the divided patterns in the stripe matches the shape of the charged beam. Hence, the throughput is increased, the manufacture is facilitated, and the pattern precision is improved.

(3) When the charged beam has an arcuate spot, if the radius of the arcuate cross-sectional electron beam and the radius of the arcuate strut matching this beam-spot shape are set to be equal to each other, a further increase in throughput can be achieved.

(4) If the divided pattern width is set to be 0.9 times or less the diameter of the arcuate cross-sectional charged beam, the mask precision can be improved.

(5) The divided pattern width and length are determined on the basis of a precision map experimentally obtained. An improvement in pattern precision can be obtained.

(6) When the divided pattern widths are set to be almost equal to each other, the number of stripes is reduced, and the throughput is increased.

(7) When the division boundary of divided patterns facing an arcuate strut has an arcuate shape, the throughput is increased.

(8) When the radius of the division boundary of the arcuate divided patterns and the radius of an arcuate strut are set to be equal to each other, a further increase in throughput can be obtained.

(9) In the case of an exposure apparatus for sequentially exposing a mask, on which the pattern to be exposed is divided into a plurality of regions, with an arcuate cross-sectional charged beam, thereby projecting the pattern onto a photosensitive substrate, if the width of the charged beam on the mask is set smaller than the width of the struts separating the plurality of regions, and if a charged beam having a smaller spot diameter than the width of the struts is scanned in a direction along which the bars separating the plurality of regions are arranged, to sequentially expose the pattern, the precision of the pattern projected is improved.

(10) In the above exposure apparatus, when a non-linear strut is arcuate to match the spot shape of the arcuate cross-sectional charged beam, if the radius of the arc of the charged beam is set to be substantially equal to the radius of the arc of the strut, a further increase in throughput can be obtained.

(11) In the above exposure apparatus, when a non-linear strut is arcuate to match the spot shape of the arcuate cross-sectional charged beam, if the bending direction of the arc of the charged beam is set to be in substantially the same direction as that of the non-linear strut, the throughput can be increased.

(12) In a method of manufacturing an electronic device by projecting a pattern onto a substrate by stitching a plurality of divided regions, if some of the plurality of regions form arcs, the throughput is increased and the device cost is reduced.

As many apparently widely different embodiments of the present invention can be made without departing from the spirit and scope thereof, it is to be understood that the invention is not limited to the specific embodiments thereof except as defined in the appended claims.

What is claimed is:

1. A charged beam mask comprising:
   a pattern to be exposed which is divided into a plurality of regions; and
   a strut separating said plurality of regions, said strut having a width larger than a width of a charged beam on said mask,
   wherein part of said strut separating said plurality of regions has a shape matching a shape of the charged beam.

2. The mask according to claim 1, wherein said strut having the shape matching the shape of the charged beam extends in only one direction.

3. The mask according to claim 1, wherein said regions have pattern widths substantially equal to each other.

4. The mask according to claim 1, wherein pattern widths and lengths of said regions are determined on the basis of a precision map experimentally obtained.

5. The mask according to claim 1, wherein the charged beam has an arcuate spot.

6. The mask according to claim 5, wherein a pattern width of said regions is not more than 0.9 times a diameter of the arcuate cross-sectional charged beam.

7. The mask according to claim 5, wherein a radius of the arcuate cross-sectional charged beam and a radius of the arcuate strut are substantially equal to each other.

8. The mask according to claim 5, wherein a division boundary of patterns in said regions facing the arcuate strut has an arcuate shape.

9. The mask according to claim 8, wherein a radius of the division boundary of the arcuate patterns in each of said regions and a radius of the arcuate strut are substantially equal to each other.

10. A charged beam mask comprising:
    a pattern to be exposed which is divided into a plurality of regions; and
    a boundary of said plurality of regions, said boundary having a width larger than a width of a charged beam on said mask,
    wherein part of the boundary of said plurality of regions has a shape matching a shape of the charged beam.

11. The mask according to claim 10, wherein the boundary having the shape matching the shape of the charged beam extends in only one direction.

12. The mask according to claim 10, wherein said regions have pattern widths substantially equal to each other.

13. The mask according to claim 10, wherein pattern widths and lengths of said regions are determined on the basis of a precision map experimentally obtained.

14. The mask according to claim 11, wherein the charged beam has an arcuate spot.

15. The mask according to claim 14, wherein a pattern width of said regions is not more than 0.9 times a diameter of the arcuate cross-sectional charged beam.

16. The mask according to claim 14, wherein a radius of the arcuate cross-sectional charged beam and a radius of the arcuate boundary are substantially equal to each other.

17. A charged beam mask comprising:
    a pattern to be exposed which is divided into a plurality of regions,
    wherein a boundary of said plurality of regions has a width larger than a width of a charged beam on said mask in a scanning direction during exposure and part of the boundry of said plurality of regions has a shape matching a shape of the charged beam.

* * * * *

UNITED STATES PATENT AND TRADEMARK OFFICE
CERTIFICATE OF CORRECTION

PATENT NO.    : 6,335,127 B1
DATED         : January 1, 2002
INVENTOR(S)   : Haruhito Ono It is certified that error appears in the above-identified patent and that said Letters Patent is hereby corrected as shown below:

<u>Column 6,</u>
Lines 61and 62, "Wb1" should read -- wb1 --.

Signed and Sealed this

Fourth Day of June, 2002

Attest:

Attesting Officer

JAMES E. ROGAN
*Director of the United States Patent and Trademark Office*